(12) United States Patent  
Wright et al.

(10) Patent No.: US 8,902,131 B2  
(45) Date of Patent: Dec. 2, 2014

(54) CONFIGURABLE LIQUID CRYSTAL DISPLAY DRIVER SYSTEM

(75) Inventors: David Wright, San Diego, CA (US); Jason Muriby, San Diego, CA (US); Erhan Hancioglu, San Diego, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 1298 days.

(21) Appl. No.: 11/864,137

(22) Filed: Sep. 28, 2007

(65) Prior Publication Data

US 2008/0259065 A1 Oct. 23, 2008

Related U.S. Application Data

(60) Provisional application No. 60/912,577, filed on Apr. 18, 2007.

(51) Int. Cl.
  *G09G 3/18* (2006.01)
  *G09G 3/36* (2006.01)
  *H03K 19/00* (2006.01)
  *H03K 19/003* (2006.01)

(52) U.S. Cl.
  CPC ...... *H03K 19/0016* (2013.01); *H03K 19/00369* (2013.01)
  USPC ............................... 345/52; 345/38; 345/100

(58) Field of Classification Search
  CPC ........... G09G 3/04; G09G 3/045; G09G 3/16; G09G 3/18; G09G 3/3622; G09G 3/3681; G09G 3/3692; G09G 2310/0278; G09G 2310/0289
  USPC .............. 345/33–35, 38, 50–52, 87–104, 204
  See application file for complete search history.

(56) References Cited

U.S. PATENT DOCUMENTS 4,571,507 A 2/1986 Collings
4,692,760 A * 9/1987 Unno et al. ..................... 345/30

(Continued)

FOREIGN PATENT DOCUMENTS

JP 5041651 A 2/1993

OTHER PUBLICATIONS

Pacific Display Devices, 'Multiplex Drive and Bias of LCD Technology', published Dec. 19, 2005, Retrieved from the Internet: <URL: http://web.archive.org/web/20051219043843/http://www.pacificdisplay.com/lcd_multiplex_drive.htm>.*

(Continued)

*Primary Examiner* — Joe H Cheng
*Assistant Examiner* — Keith Crawley (57) ABSTRACT

Embodiments of the invention relate to a configurable LCD driver system having a plurality of configurable LCD drivers. Each LCD driver may be configured as a common or segment driver by selecting a drive voltage from an appropriate set of drive voltages associated with a common or segment driver in accordance with certain parameters, such as whether a user may configure the LCD driver as a common driver or segment driver, a multiplex ratio, and/or bias ratio of an LCD panel. The drive time and drive strength associated with the LCD driver may also be configurable. The selected drive voltage may be provided to a drive buffer to output an LCD drive voltage waveform for driving one or more segments or pixels in an LCD panel. A memory may store appropriate display data for both the segment and common drivers to control the output drive capability of the LCD driver.

17 Claims, 5 Drawing Sheets

(56) References Cited

U.S. PATENT DOCUMENTS

| | | | |
|---|---|---|---|
| 4,839,636 A * | 6/1989 | Zeiss | 345/30 |
| 4,988,983 A | 1/1991 | Wehrer | |
| 5,508,715 A * | 4/1996 | Kuroki | 345/51 |
| 5,845,181 A | 12/1998 | Bartscher | |
| 5,867,015 A | 2/1999 | Corsi et al. | |
| 5,949,408 A * | 9/1999 | Kang et al. | 345/169 |
| 6,040,707 A | 3/2000 | Young et al. | |
| 6,118,439 A * | 9/2000 | Ho et al. | 345/211 |
| 6,124,840 A | 9/2000 | Kwon | |
| 6,141,007 A | 10/2000 | Lebling et al. | |
| 6,204,831 B1 * | 3/2001 | Nishioka et al. | 345/53 |
| 6,225,992 B1 * | 5/2001 | Hsu et al. | 345/211 |
| 6,701,508 B1 | 3/2004 | Bartz et al. | |
| 6,801,178 B2 | 10/2004 | Nitta et al. | |
| 6,807,109 B2 | 10/2004 | Tomishima | |
| 6,812,678 B1 | 11/2004 | Brohlin | |
| 6,909,414 B2 | 6/2005 | Tsuchi et al. | |
| 6,960,953 B2 | 11/2005 | Ichihara | |
| 6,966,039 B1 | 11/2005 | Bartz et al. | |
| 6,989,659 B2 | 1/2006 | Menegoli et al. | |
| 7,010,773 B1 | 3/2006 | Bartz et al. | |
| 7,319,999 B2 | 1/2008 | Evans | |
| 7,348,861 B1 | 3/2008 | Wu et al. | |
| 7,391,204 B2 | 6/2008 | Bicking | |
| 7,397,226 B1 | 7/2008 | Mannama et al. | |
| 7,612,527 B2 | 11/2009 | Hoffman et al. | |
| 7,667,708 B2 | 2/2010 | Kamijo et al. | |
| 8,085,020 B1 | 12/2011 | Bennett | |
| 8,164,365 B2 | 4/2012 | Wright et al. | |
| 2002/0011979 A1 | 1/2002 | Nitta et al. | |
| 2002/0033804 A1 | 3/2002 | Liang et al. | |
| 2003/0112215 A1 | 6/2003 | Hector et al. | |
| 2003/0122734 A1 | 7/2003 | Chien et al. | |
| 2004/0046724 A1 | 3/2004 | Woo et al. | |
| 2004/0056833 A1 | 3/2004 | Kitagawa et al. | |
| 2004/0070559 A1 | 4/2004 | Liang | |
| 2004/0145551 A1 | 7/2004 | Tobita | |
| 2004/0189573 A1 | 9/2004 | Lee et al. | |
| 2004/0217799 A1 | 11/2004 | Ichihara | |
| 2004/0250231 A1 | 12/2004 | Killian et al. | |
| 2005/0052394 A1 | 3/2005 | Waterman | |
| 2005/0057482 A1 | 3/2005 | Youngblood et al. | |
| 2005/0140659 A1 | 6/2005 | Hohl et al. | |
| 2006/0001671 A1 | 1/2006 | Kamijo et al. | |
| 2006/0239746 A1 | 10/2006 | Grant | |
| 2006/0244739 A1 | 11/2006 | Tsai | |
| 2007/0002007 A1 | 1/2007 | Tam | |
| 2007/0139338 A1 * | 6/2007 | Lin et al. | 345/96 |
| 2007/0139403 A1 | 6/2007 | Chung | |
| 2007/0159425 A1 | 7/2007 | Knepper et al. | |
| 2008/0131145 A1 | 6/2008 | Tao et al. | |
| 2008/0203977 A1 | 8/2008 | Raimar et al. | |
| 2008/0259017 A1 | 10/2008 | Wright et al. | |
| 2008/0259070 A1 | 10/2008 | Snyder et al. | |
| 2009/0054129 A1 | 2/2009 | Yoshimura et al. | |
| 2011/0234264 A1 | 9/2011 | Wright et al. | |
| 2011/0248692 A1 | 10/2011 | Shehu et al. | |

OTHER PUBLICATIONS

U.S. Appl. No. 13/432,038 (CD11093): "Systems and Methods for Starting up Analog Circuits," Gary Moscaluk, dated Mar. 28, 2012; 24 pages.

International Search Report for International Application PCT/US08/60699 (CD2007101PCT) mailed Jun. 18, 2009; 6 pages.

Jinbin Zhao, et al.__Steady-State and Dynamic Analysis of a Buck Converter Using a Hysteretic PWM Control__Dated 2004__5 pages.

Mohammad Al-Shyoukh and Hoi Lee__A Compact Fully-Integrated Extremum-Selector-Based Soft-Start Circuit for Voltage Regulators in Bulk CMOS Technologies__Oct. 2010__5 pages.

U.S. Appl. No. 61/566,233 (CD11093P1): "Fast Startup Circuit and Method for Ultra Low Power Analog Circuits," Gary Moscaluk, dated Dec. 2, 2011; 11 pages.

Search Report for U.S. Appl. No. 13/432,038 (CD11093), Dated Mar. 2012; 12 pages.

The Written Opinion of the International Searching Authority for International Application No. PCT/US08/60699 mailed Jun. 18, 2009; 4 pages.

USPTO Advisory Action for U.S. Appl. No. 11/965,520 (CD07101) dated Aug. 23, 2011; 3 pages.

USPTO Final Rejection for U.S. Appl. No. 11/965,520 (CD07101) dated Jun. 8, 2011; 14 pages.

USPTO Final Rejection for U.S. Appl. No. 11/965,520 (CD07101) dated Aug. 6, 2012; 13 pages.

USPTO Non-Final Rejection for U.S. Appl. No. 11/965,520 (CD07101) dated Sep. 29, 2010; 11 pages.

USPTO Non-Final Rejection Number For U.S. Appl. No. 11/965,520 (CD07101) dated Dec. 7, 2011; 11 pages.

U.S. Appl. No. 11/965,520 "Active Liquid Crystal Display Drivers and Duty Cycle Operation," Warren Snyder et al., Filed on Dec. 27, 2007; 28 pages.

USPTO Advisory Action for U.S. Appl. No. 11/965,520 dated Sep. 11, 2013; 3 pages.

USPTO Advisory Action for U.S. Appl. No. 11/965,520 dated Oct. 17, 2012; 2 pages.

USPTO Final Rejection for U.S. Appl. No. 11/965,520 dated Jul. 8, 2013; 10 pages.

USPTO Non-Final Rejection for U.S. Appl. No. 11/965,520 dated Dec. 18, 2012; 13 pages.

USPTO Notice of Allowance for U.S. Appl. No. 11/965,520 dated Jan. 16, 2014; 5 pages.

USPTO Notice of Allowance for U.S. Appl. No. 11/965,520 dated Nov. 18, 2013; 7 pages.

* cited by examiner

CONFIGURABLE LIQUID CRYSTAL DISPLAY DRIVER SYSTEM

RELATED APPLICATIONS

This application claims the benefit of U.S. Provisional Application No. 60/912,577, filed Apr. 18, 2007, which is incorporated herein by reference.

TECHNICAL FIELD

The present disclosure relates generally to integrated circuits, and more particularly to a configurable liquid crystal display (LCD) driver system.

BACKGROUND

A conventional LCD driver circuit may comprise a random access memory (RAM) for storing data to be displayed on an LCD panel. The RAM may be supplied by an interface logic, which receives instructions from a set of programming inputs. The RAM may supply the stored data to a latch circuit, which may include a plurality of data latches. A set of shift registers may be coupled to the latch circuit. The conventional LCD driver circuit may also include a control logic and a display timing generator circuit. The control logic and the display timing generator circuit may provide appropriate signals to the latch circuit, the RAM, and the set of shift registers.

A segment driver circuit (i.e., column driver circuit) may be coupled to receive outputs from the latch circuit. The segment driver circuit may include multiple segment drivers equal to the number of columns in the LCD panel. A common driver circuit (i.e., row driver circuit) may be coupled to receive outputs from the shift registers. The common driver circuit may include multiple common drivers equal to the number of rows in the LCD panel. Each of the segment driver and common driver may output a corresponding segment signal or common signal to the LCD panel. Each segment and common signal may represent the data or graphics to be displayed on the LCD panel.

An LCD panel may have hundreds or thousands of pixels that may be energized depending on the voltage located at a junction of one of the rows and one of the columns in the LCD panel. When driving an LCD panel, a multiplex method is typically used where the display dots of the LCD panel may be divided into a number of groups. Each group may be provided with a common electrode, which is usually a row electrode. The common electrodes may be sequentially selected to drive the dots of the group, thereby producing a pattern on the LCD panel.

The above-described conventional LCD driver circuit usually has dedicated common and segment drivers with fixed output drive capability, which may cause one or more of these drivers to be wasted, as well as complicate signal routing in the LCD driver circuit.

DESCRIPTION OF EXAMPLE EMBODIMENTS

Overview

An apparatus to configure a plurality of liquid crystal display (LCD) drivers includes a reference voltage generator to generate a plurality of reference voltages; a configuration block to configure each LCD driver as one of a common driver or a segment driver according to a driver configuration state; and where each LCD driver generates an LCD drive voltage waveform from the plurality of reference voltages to drive one or more LCD segments or pixels. The configuration block comprises a control signal generator to generate signals according to at least one of a multiplex ratio, a drive bias, and the driver configuration state, where the driver configuration state indicates at least one of a drive time, a drive strength, a drive mode, and whether the LCD driver is configured as one of a common driver or a segment driver.

A method to configure a plurality of liquid crystal display (LCD) drivers, comprising: generating a plurality of reference voltages; configuring each LCD driver as one of a common driver or a segment driver according to a driver configuration state; and generating a plurality of LCD drive voltage waveforms from the plurality of reference voltages to drive one or more LCD segments or pixels. The method further includes generating control signals in accordance with at least one of a multiplex ratio, a drive bias, and the driver configuration state, where the driver configuration state indicates at least one of a drive time, a drive strength a drive mode, and whether the LCD driver is configured as a common driver or a segment driver.

BRIEF DESCRIPTION OF THE DRAWINGS

The foregoing and other objects, advantages and features will become more readily apparent by reference to the following detailed description in conjunction with the accompanying drawings.

DETAILED DESCRIPTION

Figure 1:
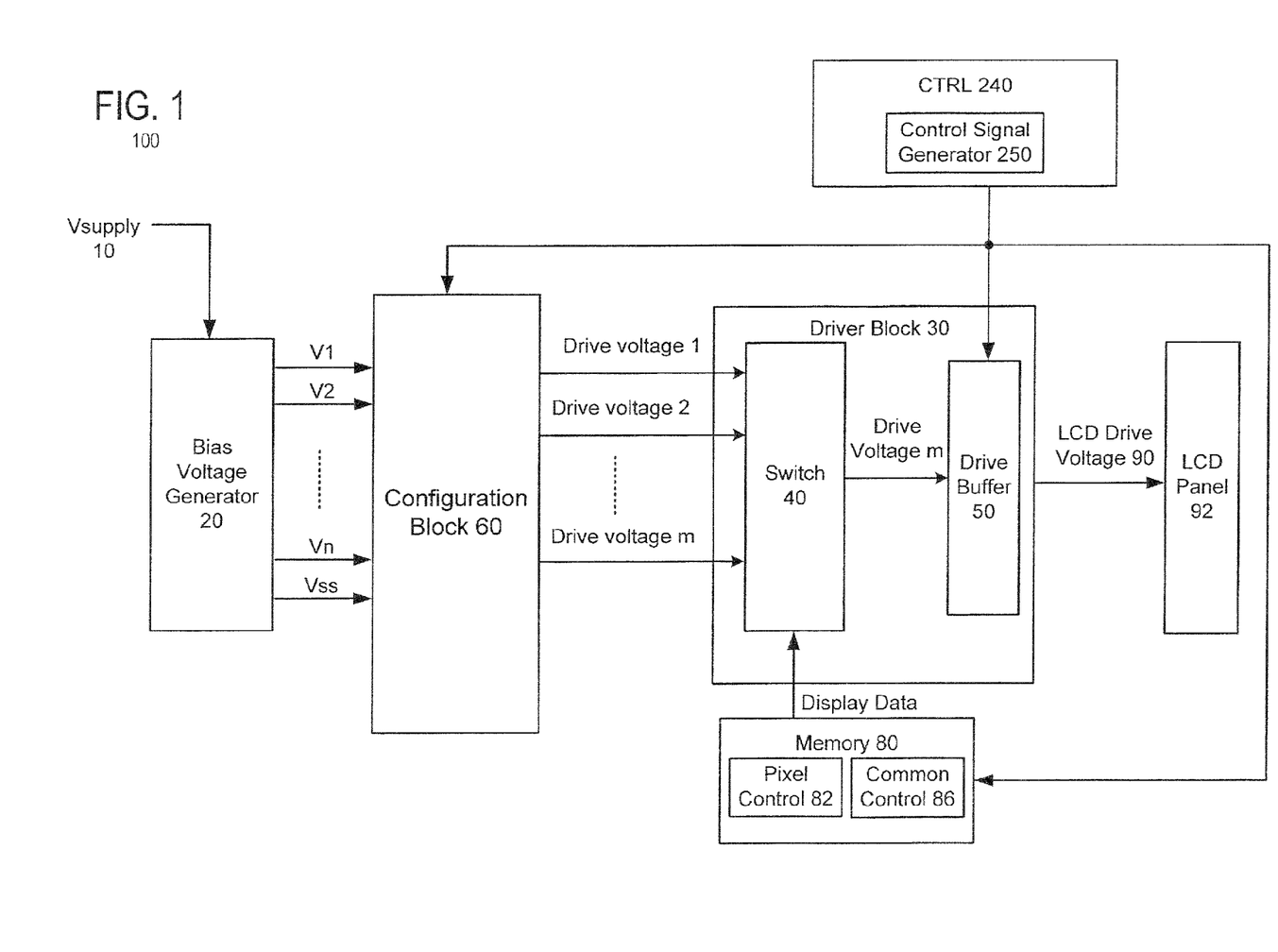
FIG. 1 is a schematic block diagram illustrating an example LCD driver circuit according to embodiments of the invention.

FIG. 1 is a schematic block diagram illustrating an example LCD driver circuit 100 according to embodiments of the invention. It should be recognized that FIG. 1 may include other elements, which have not been illustrated in order to simplify the figures and which are not necessary to understand the example system disclosed below.

Referring to FIG. 1, the LCD driver circuit 100 includes a reference voltage generator 20 to generate multiple reference voltages, such as V1, V2, . . . , Vn, and VSS (ground). The reference voltages V1, V2, . . . , Vn, and VSS (ground) may each represent a different voltage level. The reference voltages V1, V2, . . . Vn, and VSS (ground) may allow the LCD driver circuit 100 to output a plurality of LCD drive voltage waveforms 90 to drive one or more segments or pixels in an LCD panel 92. The LCD drive voltage waveforms 90 represent the data or graphics that may be displayed on the LCD panel 92 over a period of time.

A common driver may be associated with one set of drive voltages, while a segment driver may be associated with a different set of drive voltages. The drive voltages associated with the common or segment driver may be generated from the reference voltages V1, V2, . . . , Vn, and VSS (ground). The number of drive voltages associated with the common or segment driver may depend on a multiplex ratio and a drive bias. The multiplex ratio is a number used to describe a duration that a segment in the LCD panel 92 is activated, while the drive bias varies with the multiplex ratio, and may be defined as the following:

drive bias=1/(sqrt(multiplex ratio)+1)

The following table shows various multiplex ratios, drive bias and the number of drive voltages associated with the common or segment driver.

TABLE 1

Multiplex ratio, bias ratio, and drive voltages

| Multiplex ratio | 16:1 | 8:1 | 4:1 | 3:1 | 2:1 |
|---|---|---|---|---|---|
| Drive Bias | 1/5 | 1/4 | 1/3 | 1/3 | 1/3 |
| # of driving voltages (excluding ground) | 5 | 4 | 3 | 3 | 3 |

Referring to Table 1, for an LCD driver that supports 16:1 multiplex ratio and 1/5 drive bias, a common driver may be associated with a set of four drive voltages, such as VSS (ground), V0, V4, and V1, while a segment driver may be associated with another set of four drive voltages, such as VSS (ground), V0, V2, and V3. For each common and segment driver, a drive voltage may be selected from the associated set of drive voltages to generate the LCD drive voltage waveform 90 for driving a segment or pixel in the LCD panel 92.

The LCD driver circuit 100 may include a plurality of driver blocks 30. Although FIG. 1 shows four driver blocks 30, the LCD driver circuit 100 may include any number of driver blocks 30. The LCD driver circuit 100 further includes a configuration block 240 to configure each driver block 30 as a common or segment driver, as well as the drive time and drive strength of each driver block 30, in accordance with certain configuration parameters, such as the multiplex ratio, the drive bias, and whether a user may wish to configure the driver block 30 as either a common driver or segment driver. The configuration parameters may be fixed or programmable.

The configuration block 240 may include a control signal generator 250 that generates appropriate control signals to dictate which particular drive voltage that the switch array 40 of the driver block 30 may select from the reference voltages V1, V2, ..., Vn, and VSS. For example, if the user wants to configure a particular driver block 30 as a common driver, the control signal generator 250 may generate control signals to direct the switch array 40 to select a particular drive voltage from a set of drive voltages associated with the common driver, such as VSS (ground), V0, V4, and V1, but may select another drive voltage from a different set of drive voltages, such as VSS (ground), V0, V2, and V3, if the user wants to configure the driver block 30 as a segment driver.

The control signal generator 250 may provide appropriate control signals to the drive buffer 50 of each driver block 30 to set the drive time and drive strength of the driver block 30. In some embodiments, the control signal generator 250 may provide a "drive_enable" signal to the drive buffer 50 in each driver block 30, such that as long as the "drive_enable" signal is, e.g., high, the drive buffer 50 will be active. In other embodiments, the control signal generator 250 may generate control signals to select the amount of output current in the driver buffer 50, and thus setting the drive strength.

The switch array 40 in each driver block 30 may select the particular drive voltage from the reference voltages V1, V2, ..., Vn, and VSS according to the display data in a memory 80. The memory 80 may be a random access memory (RAM) or any other storage device for storing display data. In some embodiments, the memory 80 may store a common control 86 and a pixel control 82 for both the common drivers and segment drivers. The common control 86 refers to the display data associated with the common drivers, while the pixel control 82 refers to the display data associated with the segment drivers. The pixel control 82 may be written by a central processing unit (CPU) in order to control whether a display pixel is on or off, while the common control 86 may be a fixed pattern written to the memory 80 during configuration. Embodiments of the memory mapping between the memory 80 and the LCD panel 92 will be described later. The memory 80 may store appropriate display data for both the segment and common drivers to control the output drive capability of each driver block 30.

The selected drive voltage by the switch array 40 may be provided to the input of drive buffer 50 to generate an LCD drive voltage waveform 90 for driving one or more pixels or segments in the LCD panel 92. The drive buffer 50 may operate in a high drive mode to drive the LCD drive voltage waveform 90 to a threshold voltage level. The threshold voltage level may offset the selected drive voltage by a small amount. Once the LCD drive voltage waveform 90 reaches the threshold voltage level, the driver buffer 50 may switch to a low drive mode to modify the LCD drive voltage waveform 90 to approximate the selected drive voltage, while compensating any leakage related to LCD segments or pixels so as to provide a constant voltage level at the output of the drive buffer 50.

The configuration block 240 may provide appropriate control signals to the drive buffer 50 of each driver block 30 to indicate which mode of operation, e.g., the high-drive mode, the low-drive mode, may be used for driving the LCD panel 92. The timing associated with each of these modes may be programmable for a dynamic switching between the modes or fixed. This may depend on whether the corresponding driver block 30 is configured as a common or segment driver, as the common driver and segment driver may require different mode of operation at a particular instant of time.

Figure 2:
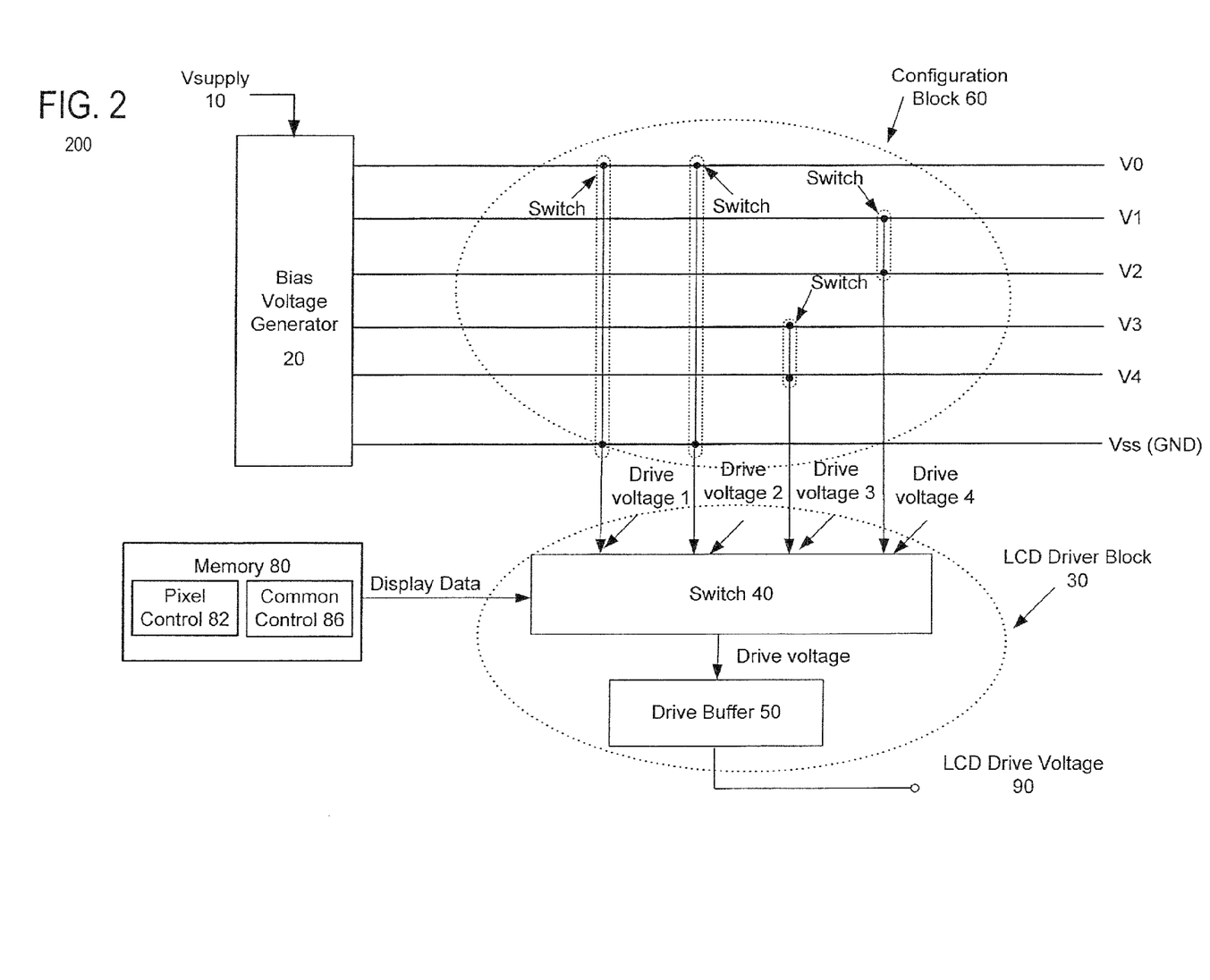
FIG. 2 is a schematic block diagram illustrating another example LCD driver circuit.

FIG. 2 is a schematic block diagram illustrating another example LCD driver circuit 200. The LCD driver circuit 200 represents a single LCD driver that may be implemented in hardware, firmware, software, or any suitable combination thereof. It should be noted that an LCD system may include a plurality of LCD drivers; each may be configured according to the LCD driver circuit 200, as explained below.

Referring to FIG. 2, the LCD driver circuit 200 includes a reference voltage generator 20 to generate multiple reference voltages, such as V0, V1, V2, V3, V4, and VSS (ground). The reference voltages V0, V1, V2, V3, V4, and VSS (ground) may each represent a different voltage level. Although FIG. 2 shows the reference voltage generator 20 outputting five reference voltages V0, V1, V2, V3, V4 and the ground VSS, the reference voltage generator 20 may output any number of reference voltages of various voltage levels. The reference voltages V0, V1, V2, V3, V4, and VSS (ground) may allow a driver block 30 to output an LCD drive voltage waveform 90, such as a common signal or a segment signal, to drive a segment or pixel in an LCD panel 92. The LCD drive voltage 90 represents the data or graphics that may be displayed on the LCD panel over a period of time.

A configuration block 240 may configure the driver block 30 as a common or segment driver, as well as the drive time and drive strength of the driver block 30, in accordance with certain configuration parameters, such as the multiplex ratio, the drive bias, whether a user may wish to configure the driver block 30 as either a common driver or segment driver, and/or the like. The configuration parameters may be fixed or programmable.

The configuration block 240 may include a control signal generator 250 that generates appropriate control signals to dictate which particular drive voltage that the switch array 40 of the driver block 30 may select from the reference voltages V1, V2, . . . , Vn, and VSS. For example, for an LCD panel that supports 16:1 multiplex ratio and 1/5 drive bias, the driver block 30 may be configured as a common or segment driver by selecting a drive voltage from a corresponding set of drive voltages between V0/VSS, V0/VSS, V3/V4, and V1/V2. That is, the driver block 30 may be configured as a common driver, if for example a drive voltage is selected from the set of drive voltages V0, VSS, V4, and V1. Otherwise, the driver block 30 may be configured as a segment driver, if for example a drive voltage is selected from a different set of drive voltages V0, VSS, V2, and V3. Although FIG. 1 shows four drive voltages drive voltage 1, drive voltage 2, drive voltage 3, and drive voltage 4 that are associated with the common or segment driver, the number of drives voltages associated with the common or segment driver may vary, which may depend on the multiplex ratio and drive bias, such as is shown in Table 1.

Since the drive time and drive strength of a common driver may be different from those of a segment driver, the control signal generator 250 may provide appropriate control signals to the drive buffer 50 to set the drive time and drive strength of the driver block 30. In some embodiments, the control signal generator 250 may provide a "drive_enable" signal to the drive buffer 50, such that as long as the "drive_enable" signal is high, the drive buffer 50 will be active. In other embodiments, the control signal generator 250 may generate control signals to select the amount of output current in the driver buffer 50, and thus setting the drive strength.

Additionally, the switch array 40 in the driver block 30 may select the drive voltage from the reference voltages V1, V2, . . . , Vn, and VSS according to the display data in a memory 80. The memory 80 may be a random access memory (RAM) or any other storage device for storing display data. In some embodiments, the memory 80 may store a common control 86 and a pixel control 82 for both the common drivers and the segment drivers. The common control 86 refers to the display data associated with a common driver, while the pixel control 82 refers to the display data associated with a segment driver. The pixel control 82 may be written by a central processing unit (CPU) in order to control whether a display pixel is on or off, while the common control 86 may be a fixed pattern written to the memory 80 during configuration. Embodiments of the memory mapping between the memory 80 and the LCD panel 92 will be described later. The memory 80 may store appropriate display data for both the segment and common drivers to control the output drive capability of the driver block 30.

The selected drive voltage by the switch array 40 may be provided to the input of the drive buffer 50 to generate the LCD drive voltage waveform 90 for driving a pixel or segment in the LCD panel 92. The drive buffer 50 may operate in a high drive mode to drive the LCD drive voltage waveform 90 to a threshold voltage level. The threshold voltage level may offset the selected drive voltage by a small amount. Once the LCD drive voltage waveform 90 reaches the threshold voltage level, the driver buffer 50 may switch to a low drive mode to modify the LCD drive voltage waveform 90 to approximate the selected drive voltage, while compensating any leakage related to the LCD segment or pixel to provide a constant voltage level at the output of the drive buffer 50.

The configuration block 240 may provide appropriate control signals to the drive buffer 50 to indicate which mode of operation, e.g., the high-drive mode, the low-drive mode, may be used for driving the LCD panel 92. The timing associated with each of these modes may be programmable for a dynamic switching between the modes or fixed depending on the segment or pixel in the LCD panel 92. The timing associated with these modes may allow the drive buffer 50 to drive various segments or pixels in the LCD panel 92.

Figure 3:
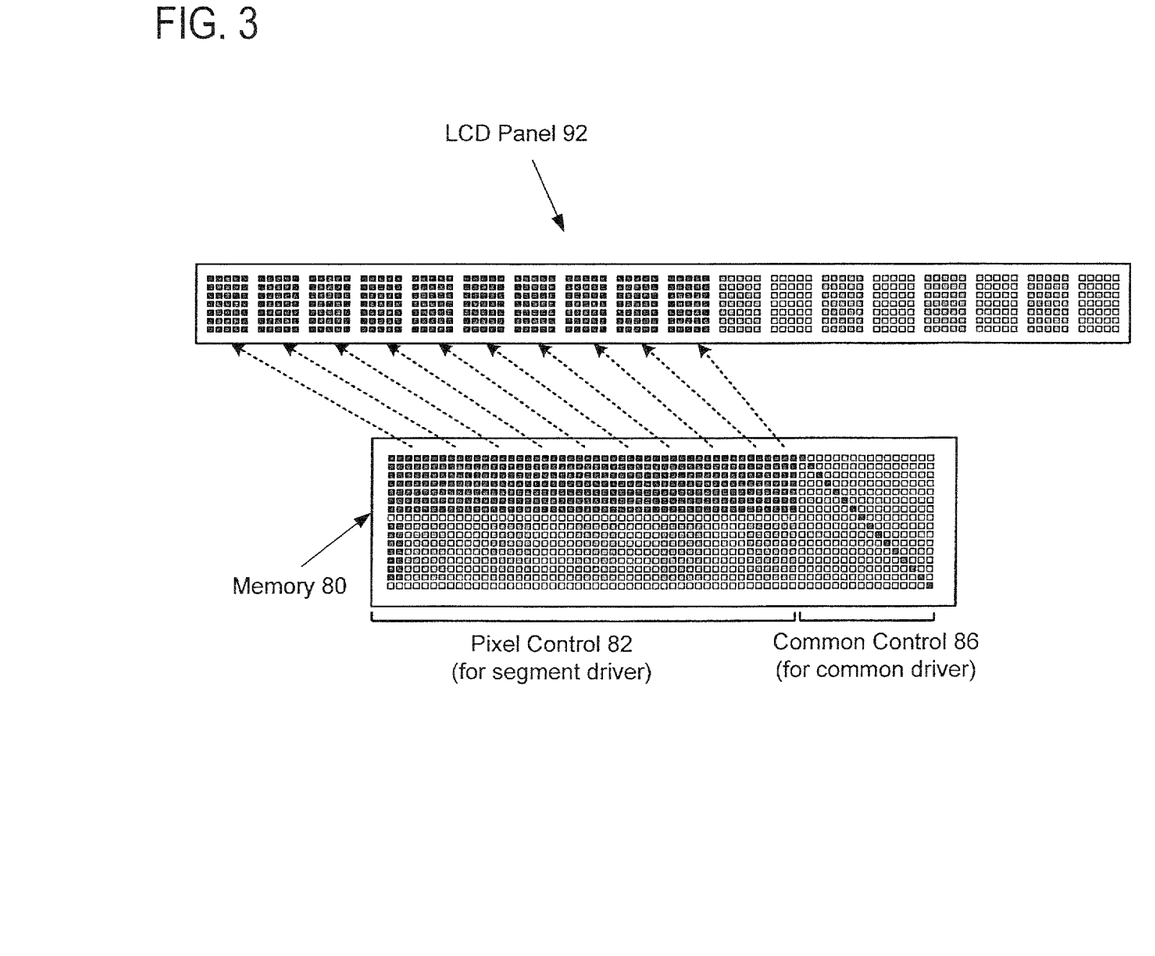
FIG. 3 is a diagram illustrating an example memory mapping between the memory and the LCD panel of FIGS. 1 and 2.
Figure 4:
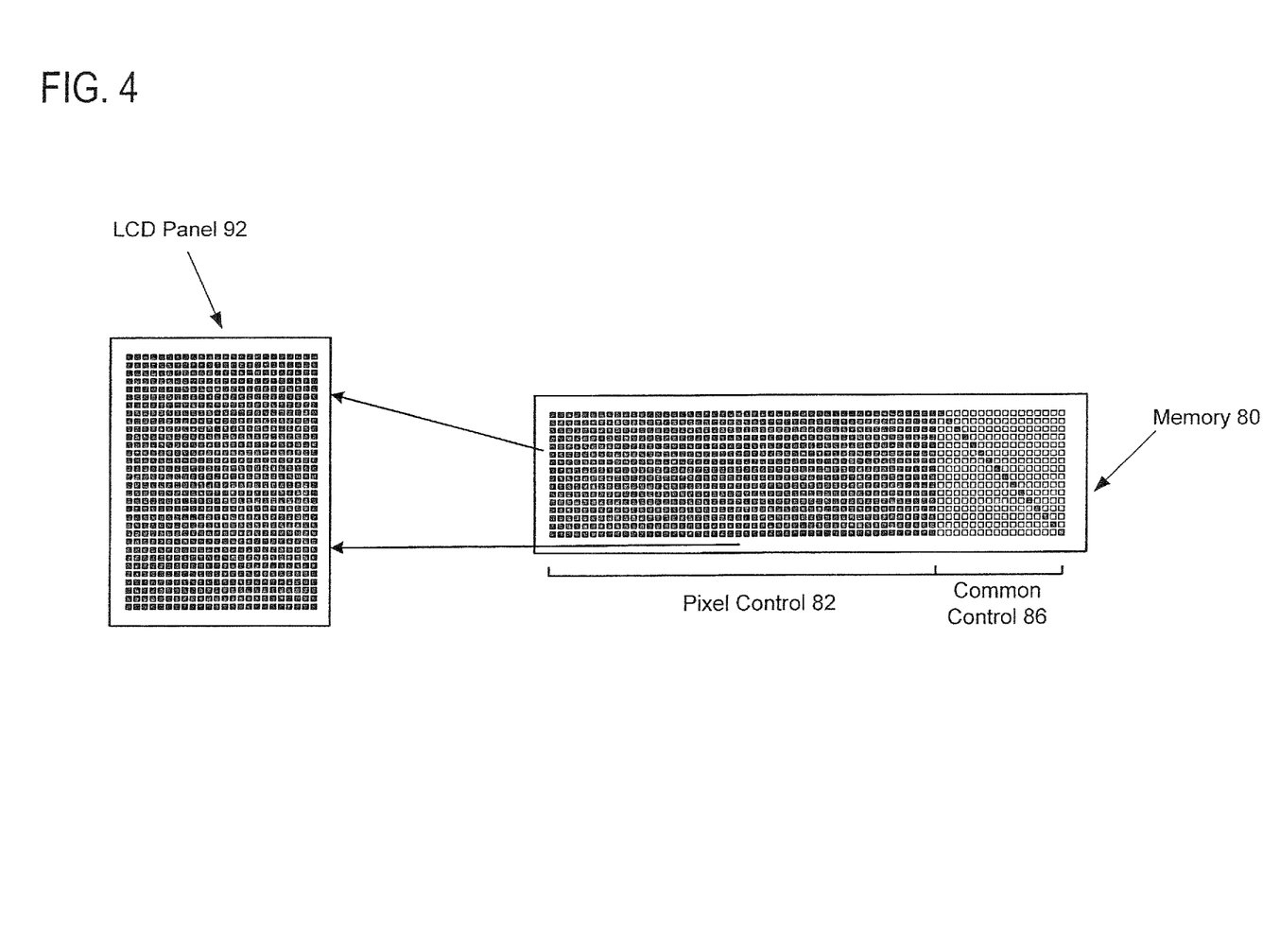
FIG. 4 is a diagram illustrating an example memory mapping between the memory and the LCD panel of FIGS. 1 and 2.

FIG. 3 is a diagram illustrating an example memory mapping between the memory and the LCD panel of FIGS. 1 and 2 for an example text display, while FIG. 4 is a diagram illustrating an example memory mapping between the memory and the LCD panel of FIGS. 1 and 2 for an example graphics display. Referring to FIG. 3 and FIG. 4 respectively, the memory 80 may store display data, such as a common control 86 and a pixel control 82, for both the common driver and the segment driver. The common control 86 refers to the display data associated with common drivers, while the pixel control 82 refers to the display data associated with the segment drivers. The pixel control 82 may be written by a central processing unit (CPU) in order to control whether a display pixel in the LCD panel 92 is on or off, while the common control 86 may be a fixed pattern written to the memory 80 during configuration. The memory 80 may store appropriate display data for both the segment and common drivers to control the output drive capability of each driver block 30 and the image displayed on the LCD panel 92.

Figure 5:
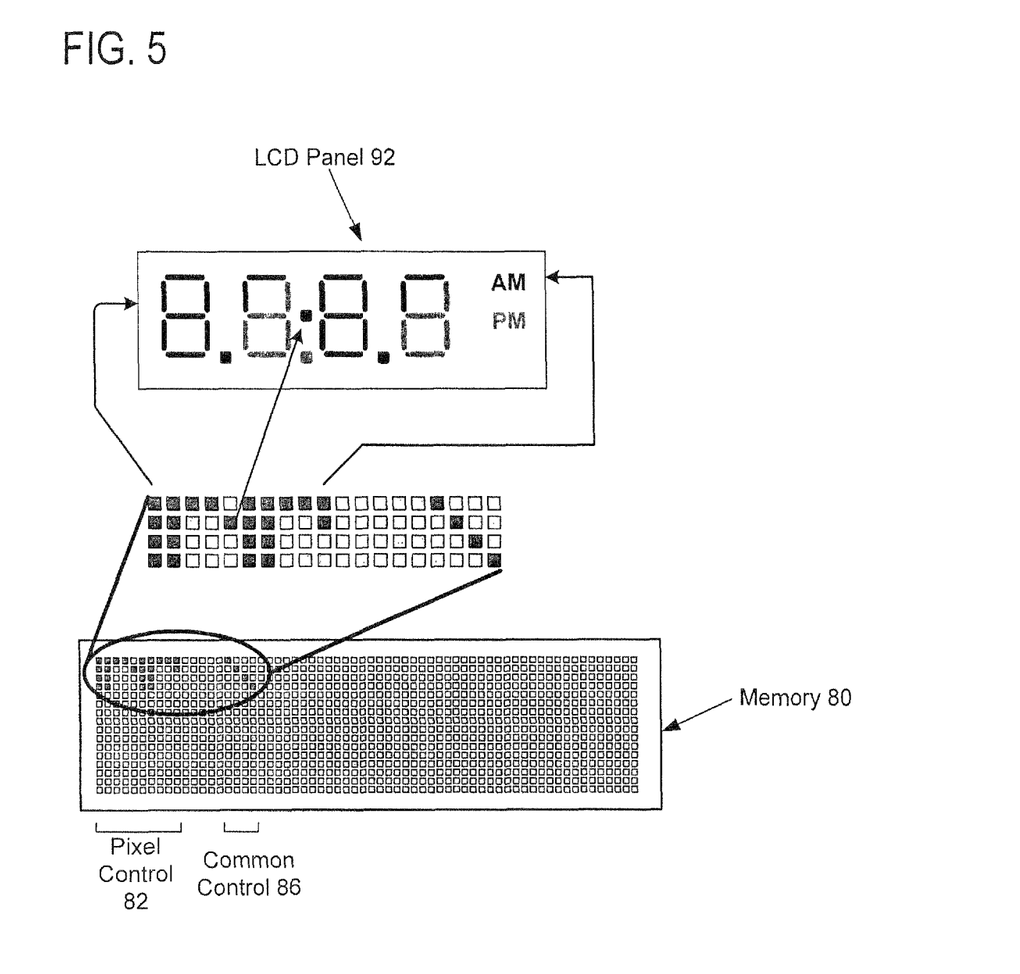
FIG. 5 is a diagram illustrating an example memory mapping between the memory and the LCD panel of FIGS. 1 and 2.

FIG. 5 is a diagram illustrating an example memory mapping between the memory and the LCD panel of FIGS. 1 and 2. Referring to FIG. 5, a small portion of the memory 80 is used for storing the display data, such as the common control 86 and the pixel control 82, for both the common drivers and the segment drivers. The unused portion of the memory 80 may be available as general purpose storage, instead of being wasted if the driver block 30 is a fixed driver, such as in a conventional LCD driver.

Embodiments of the invention relate to a configurable LCD driver system having a plurality of configurable LCD drivers. A given LCD driver may be configured as a common or segment driver by selecting a drive voltage from an appropriate set of drive voltages associated with a common or segment driver in accordance with certain parameters, such as whether a user may configure the LCD driver as a common driver or segment driver, a multiplex ratio, and/or bias ratio of an LCD panel. The drive time and drive strength associated with the LCD driver may also be configurable. The selected drive voltage may be provided to a drive buffer to output an LCD drive voltage waveform for driving one or more segments or pixels in an LCD panel. A memory may store appropriate display data for both the segment and common drivers to control the output drive capability of the LCD driver.

Further modifications and alternative embodiments of this invention will be apparent to those skilled in the art in view of this description. For example, the drive buffer 50 of FIGS. 1-2 may be implemented using two discrete drivers, such as a high-drive buffer and a low-drive buffer, or alternatively be implemented using a single driver with multiple modes, such as a high-drive mode and a low-drive mode, by changing a bias current of the drive buffer 50 between a high current mode and a low current mode. Accordingly, this description is to be construed as illustrative only and is for the purpose of teaching those skilled in the art the manner of carrying out the invention. Various changes may be made in the shape, size and arrangement and types of components or devices. For example, equivalent elements or materials may be substituted for those illustrated and described herein, and certain features of the invention may be utilized independently of the use of other features, all as would be apparent to one skilled in the art after having the benefit of this description of the invention. Alternative embodiments are contemplated and are within the spirit and scope of the following claims.

What is claimed is:

1. An apparatus to configure a plurality of liquid crystal display (LCD) driver outputs, comprising:
a reference voltage generator comprising a plurality of outputs, wherein the reference voltage generator is configured to generate one of a plurality of reference voltages at each of the plurality of outputs;
a configuration block to configure each LCD driver output as one of a common driver associated with a first subset of the reference voltages or a segment driver associated with a second subset of the reference voltages according to a driver configuration state;
a plurality of switches comprising, for each voltage in the subset of voltages, two or more switches each configured to select the voltage from one of the plurality of outputs of the reference voltage generator, wherein the configuration block is further configured to control the plurality of switches to connect each of the plurality of LCD driver outputs to at least one selected voltage of the plurality of outputs of the reference voltage generator, and wherein the number of voltages included in the first subset of the reference voltages and the number of voltages included in the second subset of the reference voltages depend on a drive bias; and
a driver block configured to select a drive voltage generated from the subset of reference voltages according to display data stored in a memory and generates an LCD drive voltage waveform from the plurality of reference voltages to drive one or more LCD segments or pixels.

2. The apparatus of claim 1, where the LCD drive voltage waveform is one of a common signal when the LCD driver output is configured as a common driver or a segment signal when the LCD driver output is configured as a segment driver.

3. The apparatus of claim 1, where the configuration block comprises a control signal generator to generate signals according to at least one of the multiplex ratio, the drive bias, and the driver configuration state, where the driver configuration state indicates at least one of a drive time, a drive strength, a drive mode, and whether the LCD driver output is configured as one of a common driver or a segment driver.

4. The apparatus of claim 3, where each LCD driver output includes a plurality of switches to select the drive voltage from the subset of reference voltages in response to the signals generated by the control signal generator.

5. The apparatus of claim 4, where each LCD driver output includes a drive buffer to generate an LCD drive voltage waveform from the selected drive voltage responsive to the signals generated by the control signal generator.

6. The apparatus of claim 5, where the driver buffer includes:
a high-drive buffer to drive the LCD drive voltage waveform to a threshold level; and
a low-drive buffer to modify the LCD drive voltage waveform to approximate the selected drive voltage, and to compensate a leakage associated with the LCD segments or pixels so as to maintain a constant voltage level at the LCD segments or pixels.

7. The apparatus of claim 1, where the memory stores display data associated with both common drivers and segment drivers.

8. A method to configure a plurality of liquid crystal display (LCD) driver outputs, comprising:
generating one of a plurality of reference voltages at each of a plurality of outputs of a reference voltage generator;
configuring each LCD driver output as one of a common driver associated with a first subset of the reference voltages or a segment driver associated with a second subset of the reference voltages according to a driver configuration state, wherein said configuring comprises controlling a plurality of switches each coupling one of the plurality of LCD driver outputs to at least one of the plurality of outputs of the voltage reference generator to select a subset of reference voltages from the plurality of reference voltages by, for each voltage in the subset of reference voltages, selecting one of the plurality of reference voltages by connecting the LCD driver output to one of the plurality of outputs of the reference voltage generator and disconnecting the LCD driver output from another of the plurality of outputs of the reference voltage generator, and wherein the number of voltages included in the first subset of the reference voltages and the number of voltages included in the second subset of the reference voltages depend on a drive bias;
selecting a drive voltage from the subset of reference voltages in response to display data stored in a memory; and
generating a plurality of LCD drive voltage waveforms from the subset of reference voltages to drive one or more LCD segments or pixels.

9. The method of claim 8, includes generating control signals in accordance with at least one of the multiplex ratio, the drive bias, and the driver configuration state, where the driver configuration state indicates at least one of a drive time, a drive strength, a drive mode, and whether the LCD driver output is configured as a common driver output or a segment driver output.

10. The method of claim 9, where generating the plurality of LCD drive voltage waveforms from the subset of reference voltages includes generating the plurality of LCD drive voltage waveforms according to the driver configuration state.

11. The method of claim 8, includes:
driving an LCD drive voltage waveform to a threshold level during a high-drive mode;
modifying the LCD drive voltage waveform to approximate the selected drive voltage during a low-drive mode; and
compensating any leakage associated with the LCD segments or pixels to provide a constant voltage level during the low-drive mode.

12. The method of claim 8, includes storing data for both common drivers and segment drivers in the memory.

13. A system to configure a plurality of liquid crystal display (LCD) driver outputs, comprising:
means for generating one of a plurality of reference voltages at each of a plurality of reference voltage outputs;
means for configuring each LCD driver output as one of a common driver associated with a first subset of the reference voltages or a segment driver associated with a second subset of the reference voltages according to a driver output configuration state by controlling a plurality of switches each coupling one of the plurality of LCD driver outputs to at least one of the plurality of reference voltage outputs to select a subset of reference voltages from the plurality of reference voltages by, for each voltage in the subset of reference voltages, selecting one of the plurality of reference voltages by connecting the LCD driver output to one of the plurality of outputs of the reference voltage generator and disconnecting the LCD driver output from another of the plurality of outputs of the reference voltage generator, wherein the number of voltages included in the first subset of the reference voltages and the number of voltages included in the second subset of the reference voltages depend on a drive bias;

means for selecting a drive voltage from the subset of reference voltages in response to display data stored in a memory; and means for generating a plurality of LCD drive voltage waveforms from the subset of reference voltages to drive one or more LCD segments or pixels.

14. The system of claim 13, includes means for generating control signals in accordance with at least one of the multiplex ratio, the drive bias, and the driver configuration state, where the driver configuration state indicates at least one of a drive time, a drive strength, a drive mode, and whether the LCD driver output is configured as a common driver or a segment driver.

15. The system of claim 14, includes means for selecting a drive voltage from the subset of reference voltages according to the driver configuration state and generating an LCD drive voltage waveform from the selected drive voltage.

16. The system of claim 15, includes:

means for driving an LCD drive voltage waveform to a threshold level during a high-drive mode;

means for modifying the LCD drive voltage waveform to approximate the selected drive voltage during a low-drive mode; and means for compensating any leakage associated with the LCD segments or pixels to provide a constant voltage level during the low-drive mode.

17. The system of claim 13, includes means for storing display data for both common drivers and segment drivers in a memory.

* * * * *